United States Patent
Tsujimoto

(10) Patent No.: US 6,767,803 B2
(45) Date of Patent: Jul. 27, 2004

(54) METHOD FOR PEELING PROTECTIVE SHEET

(75) Inventor: Masaki Tsujimoto, Tokyo (JP)

(73) Assignee: Lintec Corporation, Tokyo (JP)

( * ) Notice: Subject to any disclaimer, the term of this patent is extended or adjusted under 35 U.S.C. 154(b) by 40 days.

(21) Appl. No.: 10/267,627

(22) Filed: Oct. 10, 2002

(65) Prior Publication Data

US 2003/0070517 A1 Apr. 17, 2003

(30) Foreign Application Priority Data

Oct. 11, 2001 (JP) ........................................ 2001-313418

(51) Int. Cl.$^7$ .................. H01L 21/44; H01L 21/30; H01L 21/301
(52) U.S. Cl. .................. 438/460; 438/106; 438/107; 438/108; 438/110; 438/113; 438/459; 438/460; 438/464; 438/465; 438/977
(58) Field of Search ................. 438/106, 107, 438/108, 110, 113, 459, 460, 464, 465, 977

(56) References Cited

U.S. PATENT DOCUMENTS 6,171,163 B1 * 1/2001 Seko et al.
6,558,975 B2 * 5/2003 Sugino et al.

FOREIGN PATENT DOCUMENTS

JP 11-16862 1/1999

* cited by examiner

Primary Examiner—John F. Niebling
Assistant Examiner—Stanetta Isaac
(74) Attorney, Agent, or Firm—Lowe Hauptman Gilman & Berner LLP

(57) ABSTRACT

Chips C which have already been diced are attached to a ring frame F using an adhesive sheet, and a protective sheet S1 is attached to a circuit pattern surface of the chips C. The chips C, along with a ring frame F, are held in place on a table 27 of a protective sheet peeling apparatus 20. A supply portion for an adhesive tape T is disposed in the vicinity of a table 24, and the supplied adhesive tape T is attached to the protective sheet S1. When the protective sheet S1 is peeled from the circuit pattern surface, peeling starts from corner portions of the chips C or opposing corner positions by pulling the adhesive tape T.

18 Claims, 8 Drawing Sheets

METHOD FOR PEELING PROTECTIVE SHEET

BACKGROUND OF THE INVENTION

1. Field of the Invention

The present invention relates to a method and an apparatus for peeling a protective sheet that is attached to the circuit pattern surfaces of chips after a dicing before grinding method has been conducted.

2. Description of the Related Art

As a method for producing a semiconductor wafer, a method has been known for forming a circuit pattern on the surface of a large diameter disc-shaped wafer, grinding the backside while the surface is protected by a protective tape, and peeling the protective sheet. After the semiconductor wafer is attached to a ring frame using an adhesive sheet, it is diced into a plurality of chips in cube-shape using a dicing cutter, and is transferred in this condition to the next processes of washing, drying, die bonding, etc.

With this type of method, however, there is a concern that transfer trouble and wafer breakage, etc. will occur when using an ultra-thin wafer as a result of the warping of the wafer. Recently, to deal with such issues a method called "dicing before grinding" has been proposed. In "dicing before grinding" a wafer is diced from a surface to which a circuit pattern has been formed to a prescribed depth to form bottomed grooves, and a protective sheet is attached on the wafer surface, the wafer backside is ground until reaching the bottomed grooves, and the wafer is separated into a plurality of chips. Next, after the backsides of the chips are attached to the ring frame using an adhesive sheet, the protective sheet is peeled off and the chips are transferred to the next processes of washing, drying, die bonding, etc.

Meanwhile, as a method for peeling the protective sheet from the circuit pattern surface of the wafer, a method has been known for attaching adhesive tape with a specified length to the end portion of the protective sheet and peeling the protective sheet by pulling the adhesive tape.

When performing this type of peeling, however, if the adhesive tape is pulled improperly, there is the problem of the adhesive from the protective sheet remaining on the circuit pattern. More particularly, for example, as shown in FIG. 9, on a circuit pattern 80 on a wafer W, if protective sheet is peeled in the direction of arrow A from an end portion 80A of the circuit pattern 80, the protective sheet adhesive remains on the end portion 80A.

In addition, in the case of peeling the protective sheet from the circuit pattern surface of the ultra thin chips to which a dicing before grinding method has been conducted, when attaching protective sheet to conventional chips with a thickness of approximately 350 μm and modern chips with a thickness of approximately 30 μm to 150 μm, and then peeling the protective sheet, the rigidity of the chips will be diminished. As a result, this leads to the problem of chip breakage and damage due to the peeling resistance of the adhesive when the protective sheet is peeled.

To overcome such issues, when the inventors conducted various experiments, so that no protective sheet adhesive remains on chips C and to avoid breakage and damage to the ultra thin chips, it was verified that by regularly maintaining a specified direction in which the protective sheet is peeled it is possible to keep the adhesive from remaining on the chips and to avoid breakage and damage to the chips.

SUMMARY OF THE INVENTION

The present invention was devised in view of the above problems. An object of the present invention is to provide a method and an apparatus for peeling a protective sheet so that the adhesive of the protective sheet does not remain on the chip when the protective sheet is peeled off, and to avoid breakage and damage to ultra thin chips.

In order to achieve this object, the present invention provides a method for peeling a protective sheet that is attached to a circuit pattern surface after a dicing before grinding method is conducted on a semiconductor wafer on which a circuit pattern is formed and the semiconductor wafer is divided into chips, in which the protective sheet is peeled from the corner portions of the chips. By using this method, because the adhesion area between the protective sheet and the chips is minimized in the initial peeling period when peeling resistance is greatest, no adhesive remains on the chips and it is possible to peel the protective sheet without breakage or damage to the ultra thin chips. In other words, by peeling the protective sheet from the corner portions of the chips, the peeling resistance during the initial period can be minimized and the protective sheet can be cleanly peeled with no adhesive remaining on the corner portions of the chips, while avoiding breakage or damage to the ultra thin chips.

Also, the protective sheet peeling method can be used for chips with a thickness of 30 μm to 150 μm. Even with ultra thin chips, breakage and damage to the chips can be avoided for the mentioned reasons.

Furthermore, it is preferable to employ a method in which the protective sheet is peeled diagonally from the chips, and by doing so, breakage and damage to the chips can be avoided even more reliably.

Also, the present invention provides an apparatus for peeling a protective sheet that is attached to a circuit pattern surface after a dicing before grinding method is conducted on a semiconductor wafer on which the circuit pattern is formed and the wafer is divided into chips, in which a rotatable table on which the chips are placed is provided, and the rotational position of the table is controlled so that the protective sheet is peeled from the corner portions of the chips.

DETAILED DESCRIPTION OF THE PREFERRED EMBODIMENT

Hereinafter, one embodiment of the present invention will be described with reference to accompanying drawings.

Figure 1:
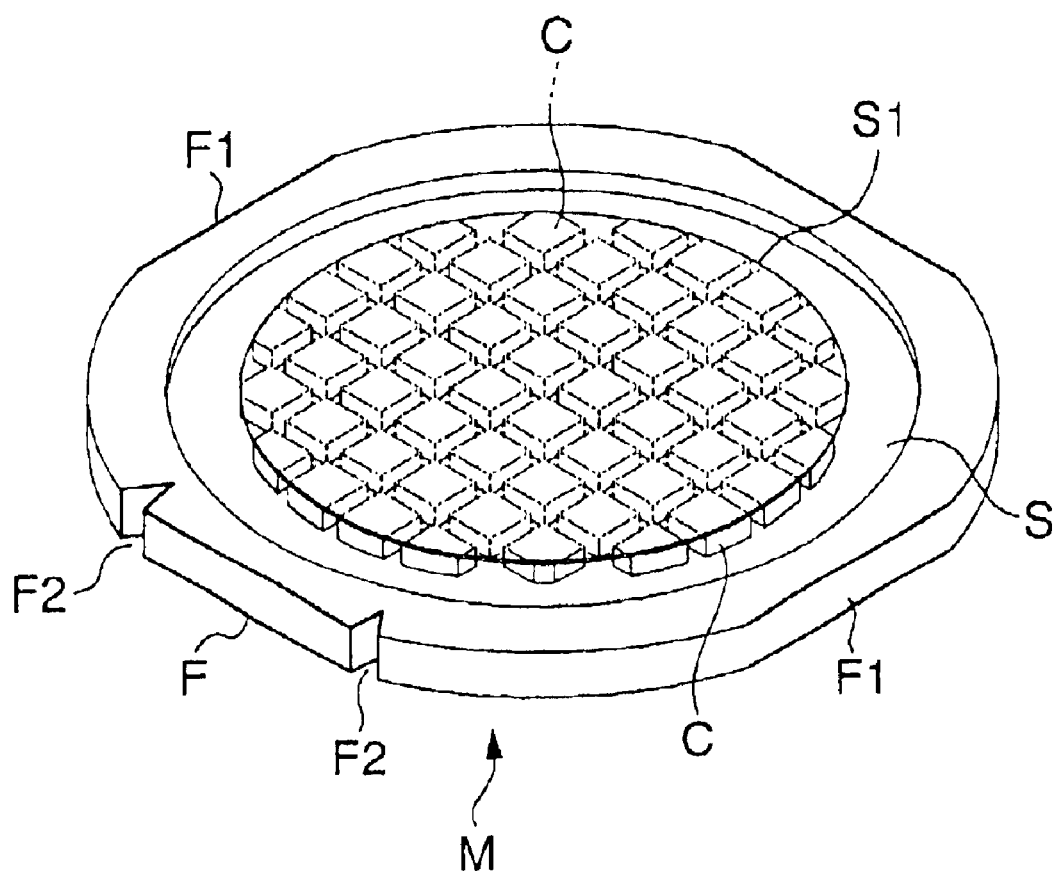
FIG. 1 is a schematic perspective viewing showing the chips to which a method according to the present invention is applied, and which are supported by a ring frame.
Figure 2:
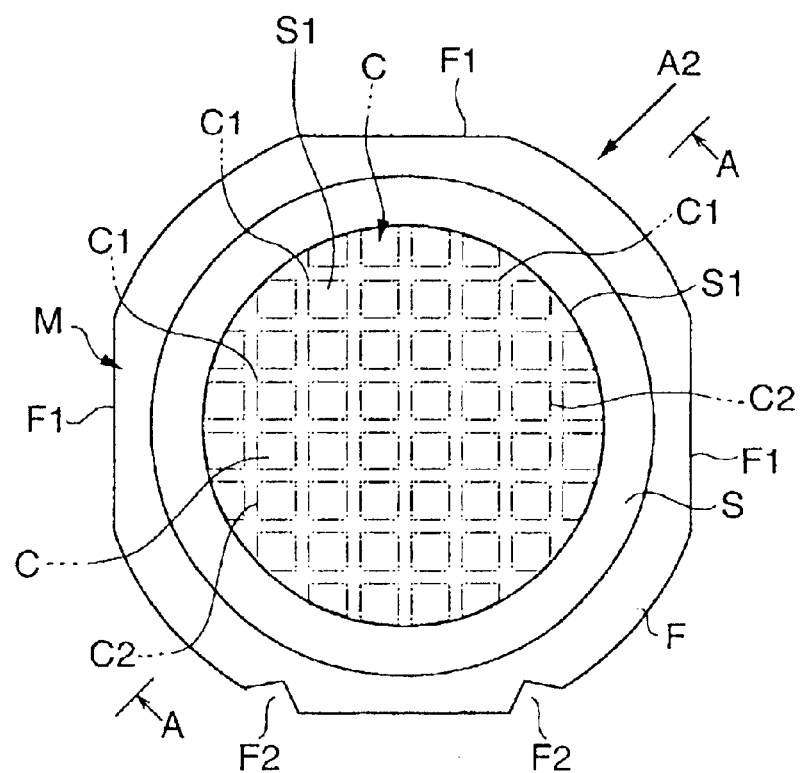
FIG. 2 is a top view of FIG. 1.
Figure 3:
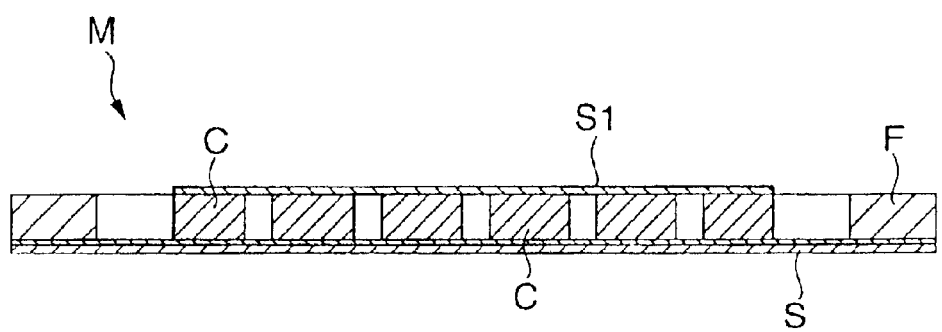
FIG. 3 is a sectional view taken along line A—A in FIG. 2.

FIG. 1 shows a schematic perspective view of an attachment body M formed by attaching chips, to which a method according to the present invention is applied, to a ring frame using an adhesive sheet. A dicing before grinding method has been conducted on the chips, and a protective sheet has been attached on surfaces of the chips formed circuit patterns. FIGS. 2 and 3 show its top view and sectional view. In these figures, a plurality of chips C to which the dicing before grinding method has been conducted is attached using an adhesive sheet S which is provided on the lower surface side of a ring frame F. A circuit pattern is formed on the surface (the upper surface in FIG. 1) of the chips C, for which ultra thin chips with a thickness of 30 μm to 150 μm are applicable, and a protective sheet S1 is attached.

Figure 5:
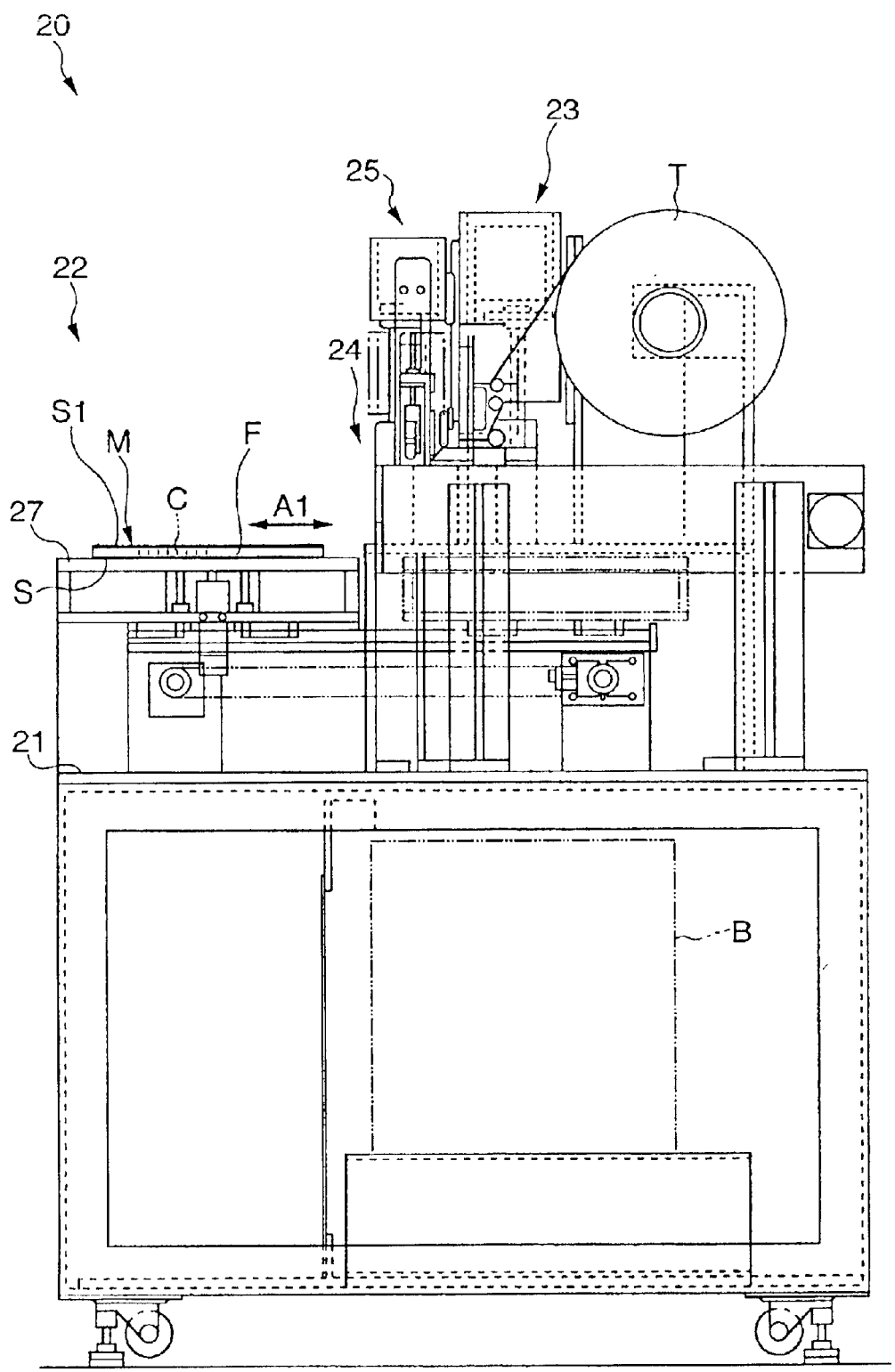
FIG. 5 is a lateral view showing the overall structure of a protective sheet peeling apparatus.

The protective sheet S1, which is attached to the chips C, is peeled by a protective sheet peeling apparatus 20 shown in FIG. 5. The protective sheet peeling apparatus 20 is provided with a base 21, a chip retention rotating mechanism 22 movable in the direction of arrow A1, a tape supply portion 23, a peel head portion 24, and a heater cutter portion 25. The chip retention rotating mechanism 22 includes a table 27, and the table 27 is provided so that the attachment body M including the ring frame that fixes the chips C using the adhesive sheet S can be held in place.

Figure 6:
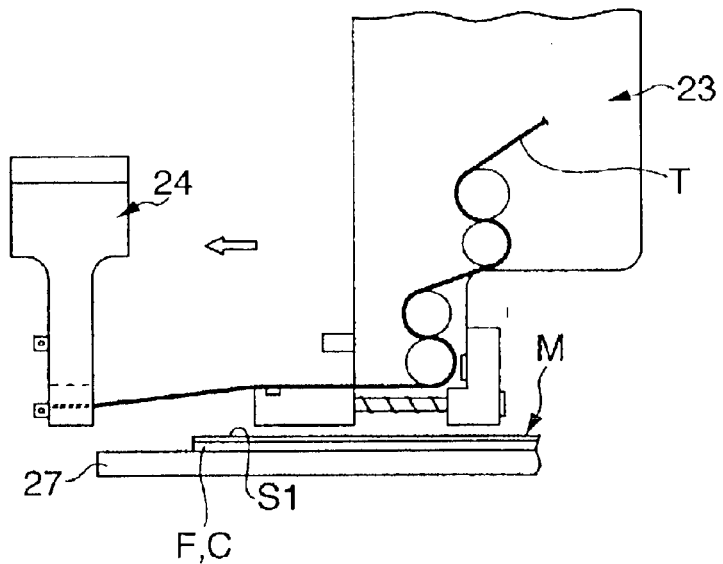
FIG. 6 shows the peeling operation of the protective sheet peeling apparatus.
Figure 6:
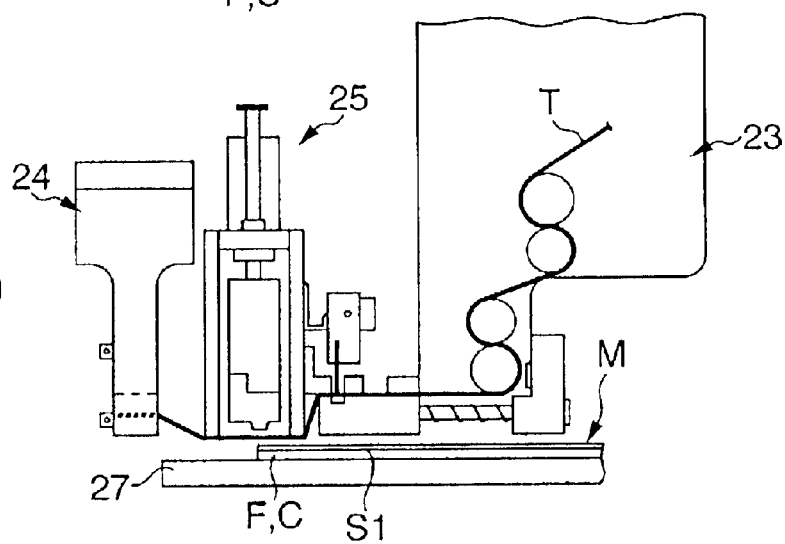
Figure 6:
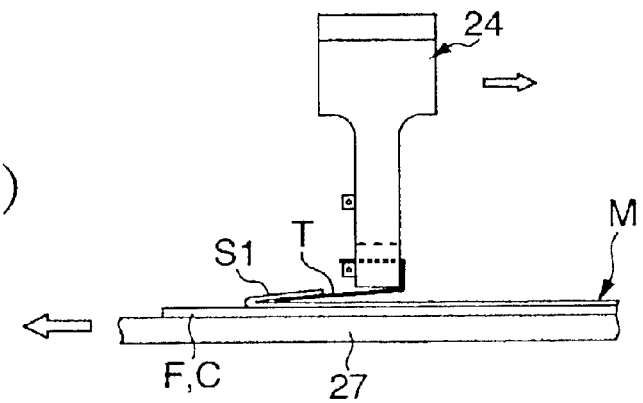

In the protective sheet peeling apparatus 20, the chips C to which the protective sheet S1 has been attached are transferred to the right in FIG. 5 with the attachment body M including the ring frame F held in place on the table 27. Meanwhile, an adhesive tape T is supplied from a tape supply portion 23 and, as shown in FIG. 6(A), is pulled by the peel head portion 24. Also, the adhesive tape T, as shown in FIG. 6(B), is thermal-pressed and attached to the end portion of the protective sheet S1 using the heater cutter portion 25 and is cut to a specified short length. After that, the peel head portion 24, as shown in FIG. 6(C), retains and pulls the adhesive tape T in the direction of the arrow on the same figure, and peels the protective sheet S1 from the surface of the chips C. At this time, the tape supply portion 23 and the heater cutter portion 25 are lifted upward and maintained such that positional interference does not occur. After this, while the table 27 moves to the left in FIG. 6(C), the peel head portion 24 relatively moves to the right in the same figure, and the protective sheet S1 that was peeled is discarded in a discard box B (refer to FIG. 5). The details of the protective sheet peeling apparatus 20 shown here are disclosed in Japanese Patent Application Laid-Open No. 11-16862.

Figure 7:
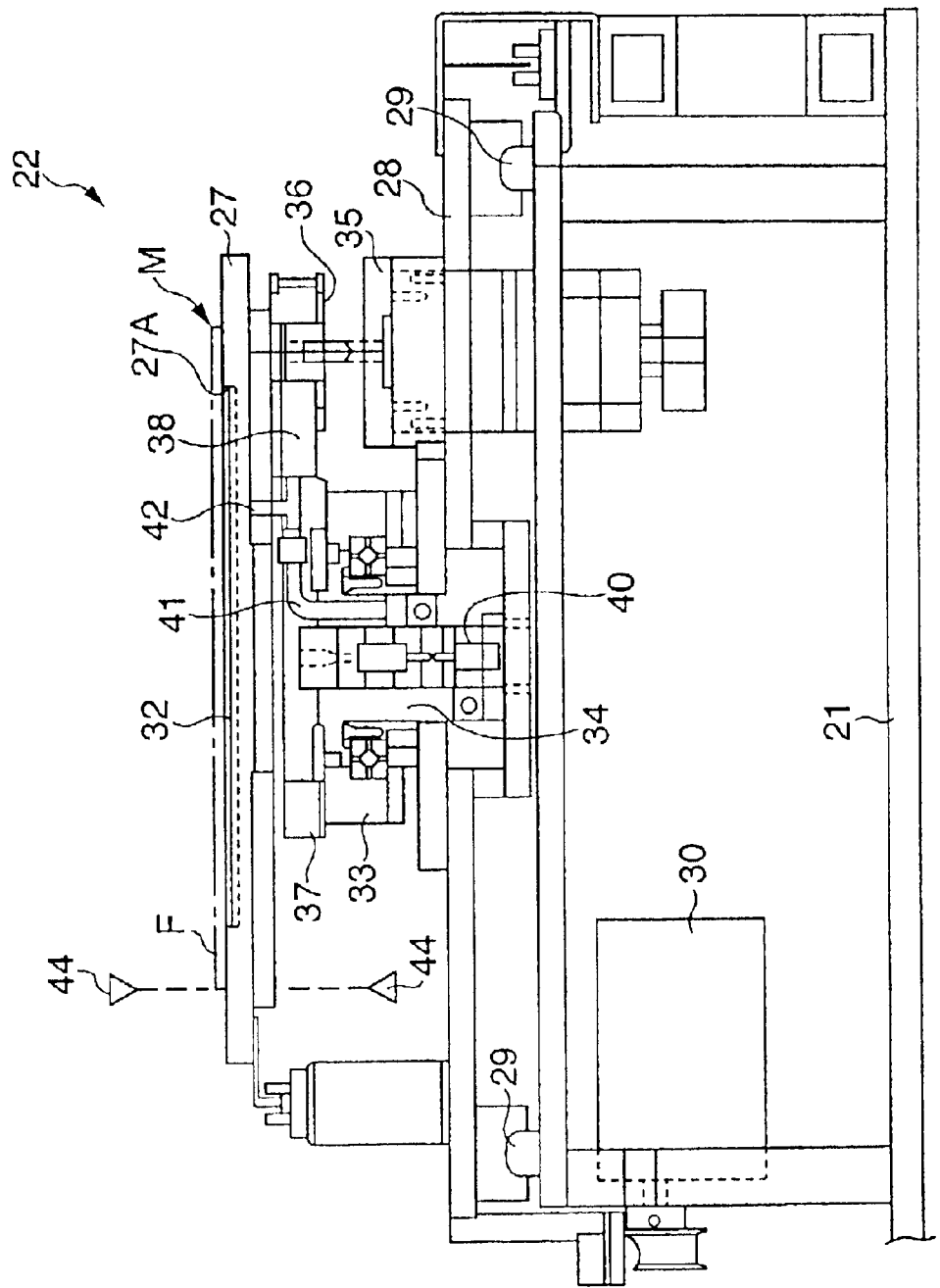
FIG. 7 is aside elevational view of the table rotating mechanism.
Figure 8:
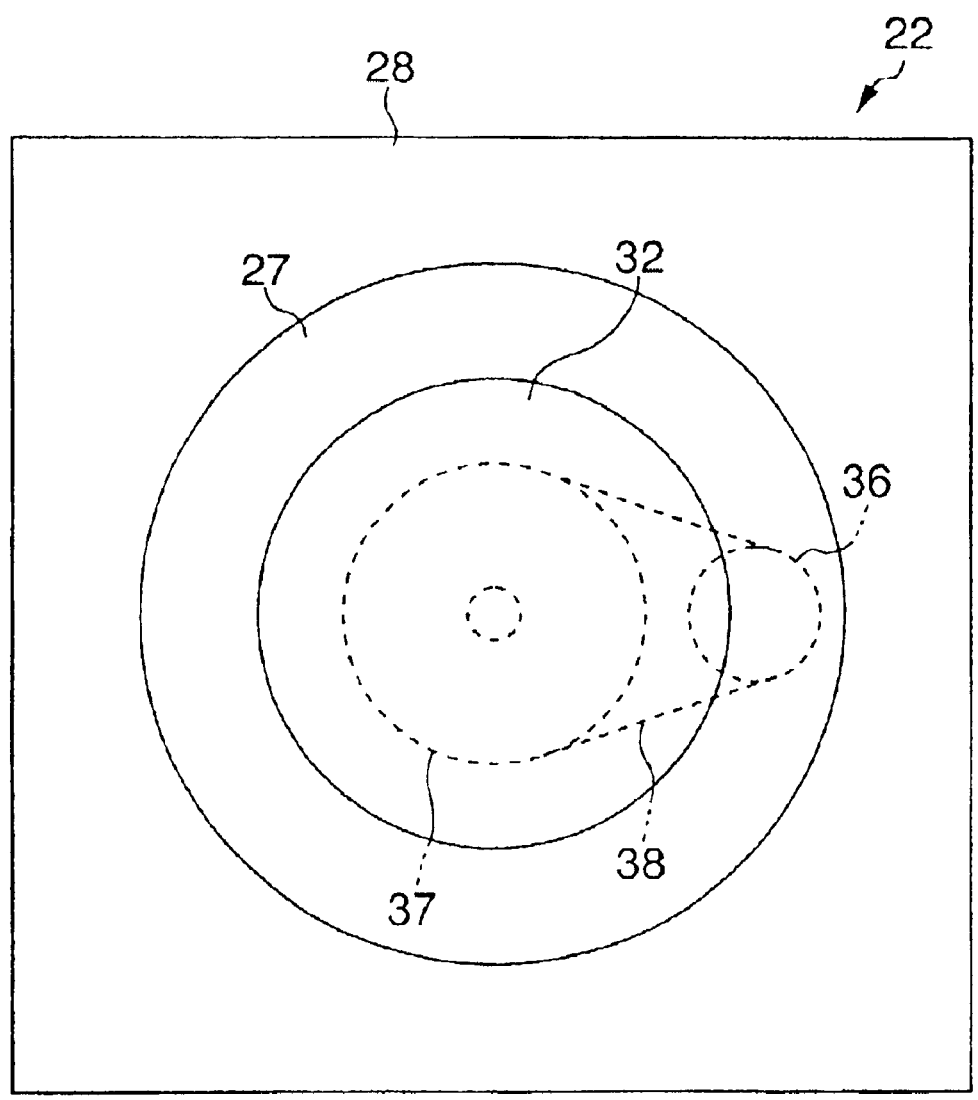
FIG. 8 is a top view of a chip retention rotating mechanism.
Figure 9:
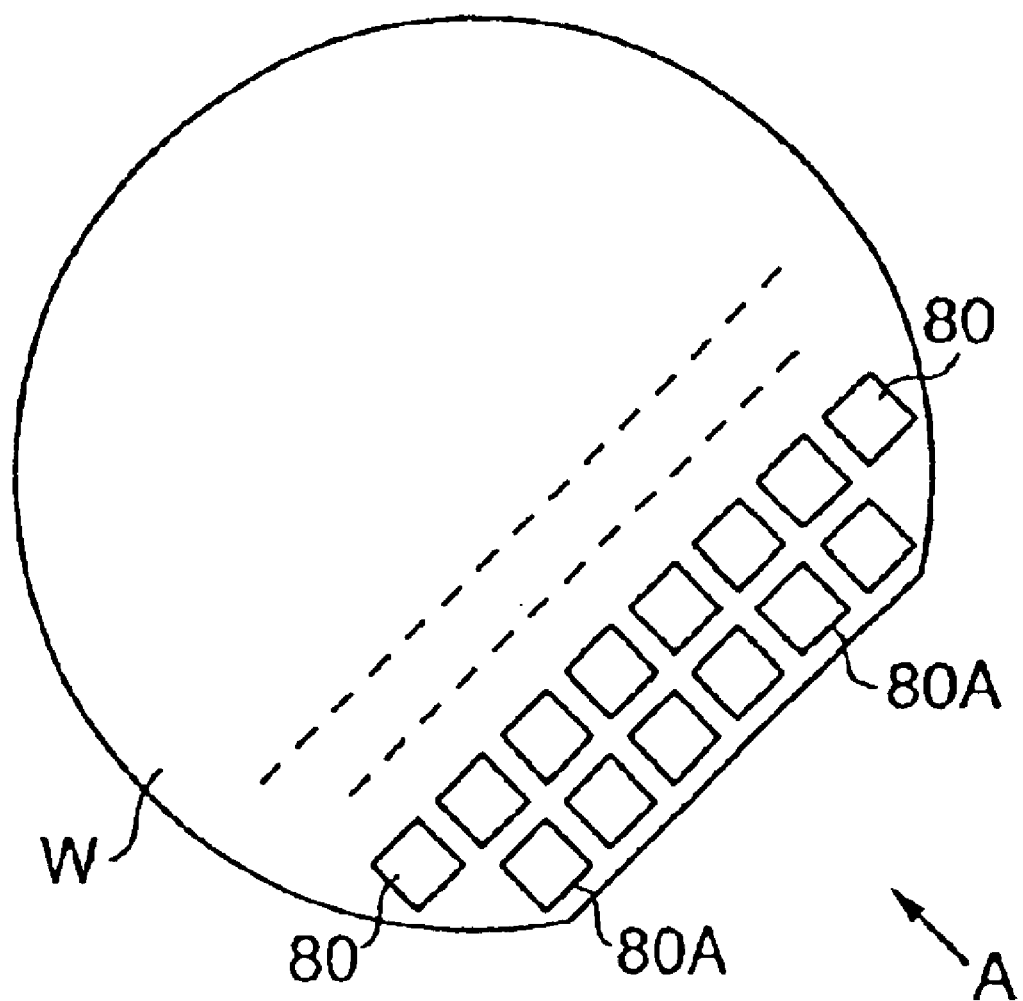
FIG. 9 is a top view illustrating a conventional peeling method.

The chip retention rotating apparatus 22, as shown in FIG. 7, is provided with a moving plate 28 which rotatably supports the table 27 that fixes the attachment body M formed by attaching the chips C to the ring frame F with the adhesive sheet S, and a rail 29 that guides the moving plate 28 in the moving direction of the chips C (in the direction of arrow A1 in FIG. 5). Herein, a motor 30 moves the moving plate 28.

In the central portion of the table 27, a chamber 27A is formed, and a perforated panel 32 is fitted into the chamber 27A. Also, a cylindrical axle 33 is fitted to the table 27, and the cylindrical axle 33 is rotatably fitted to a cylindrical bearing 34 that is fixed to the moving plate 28. Also, a motor 35 is fitted to the moving plate 28, and a pulley 36 which is fitted to the motor 35 and a pulley 37 which is fitted to the cylindrical axle 33 are connected with a timing belt 38 and a table 23 is rotationally driven by a motor 35.

In a hollow portion of a cylindrical bearing 34, a joint axle 40 is positioned, and negative pressure is applied to the chamber 27A of the table 27 via a pipe 41 and a vent 42 from the joint axle 40. Accordingly, the attachment body M, which is formed by attaching chips to the ring frame F which is held in place on the perforated panel 32, is retained on the table 27 by attaching the adhesive sheet S on the backside thereof.

In the ring frame F of the attached body M, as shown in FIG. 1, basic portions such as an orientation flat F1 and a V-notch F2 are formed, and optical sensors 44 (refer to FIG. 7) for detecting the basic portions are positioned above and below the table 23.

Next, the operation of the protective sheet peeling apparatus 20 will be described.

First, the attachment body M, which is formed by attaching the chips C to which the protective sheet S1 has been attached to the ring frame F using the adhesive sheet S, is placed on the table 27 by hand or by an automatic transfer apparatus. Next, the surface of the adhesive sheet S of the attachment body M is fixed to the table 27, and the motor 35 is driven, rotating the table 27. Then, the crystal orientation of the reference value of the chips C is detected by the optical sensors 44 using the orientation flat F1 or the V-notch F2 of the ring frame F. When the reference value is detected, the rotational angle of the chips C is determined based on the orientation of the table 27 so that the protective sheet S1 can be peeled from corner portions C1 of the chips C.

Figure 4:
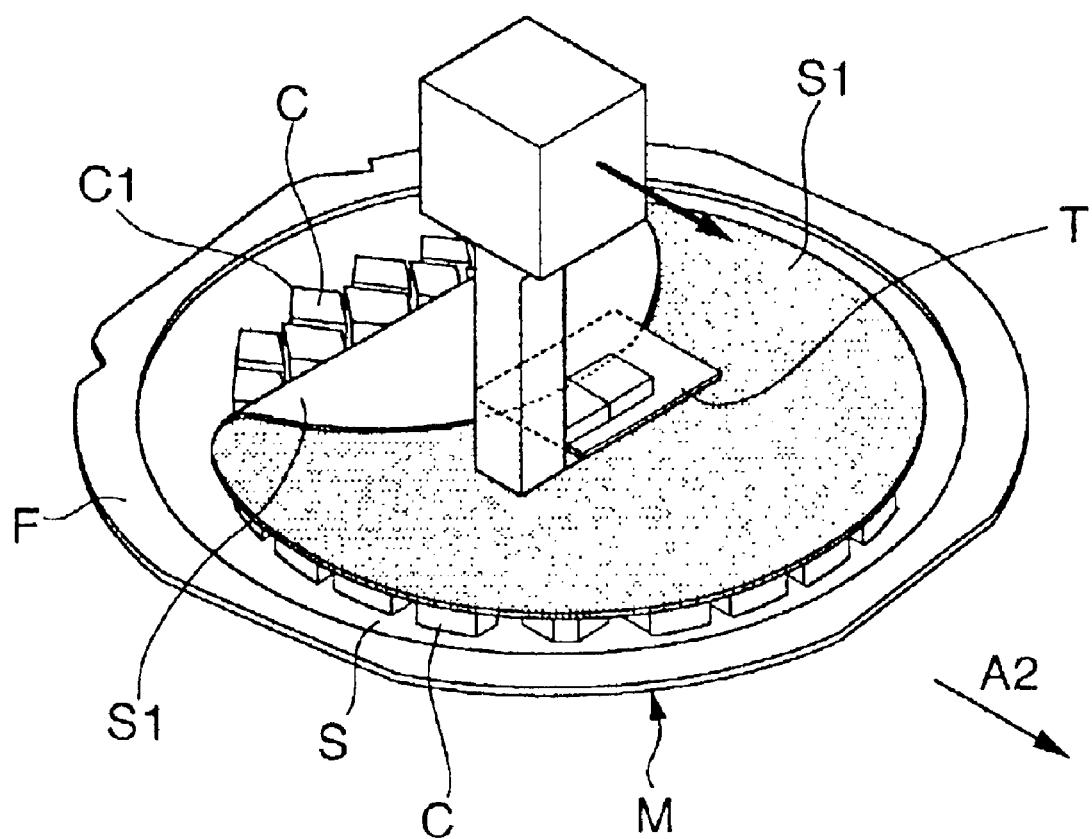
FIG. 4 is a schematic perspective view showing the peeling of the protective sheet.

For example, as shown in FIG. 2, generally edge portions C2 of the chips C are aligned parallel to the orientation flat portion F1 of the ring frame F. Herein, if the peeling direction of the protective sheet S1 is a peeling direction A2 shown in FIG. 2 and FIG. 4, the rotational angle of the chips C is determined so that the orientation flat F1 angles (e.g. at 45°) with respect to the peeling direction A2. It is possible to change and set the rotational angle appropriately so that the rotational angle is 45° with respect to the edge portions C2 of the chips C or the line showing the rotational angle matches a substantially diagonal line connecting the corner portions C1 of the chips C.

After that, the moving plate 28 is moved and as the chips C are transferred under the heater cutter portion 25, the adhesive tape T is pulled by the peel head portion 24 and attached by pressure to the edge portion of the protective sheet S1 and cut to a specified short length. Next, the peel head portion 24 retains and pulls the adhesive tape T to the right of FIG. 5 and peels the protective sheet S1 from the chips C (refer to FIG. 4). At this time, the table 27 moves in the opposite direction (the left in FIG. 6(C)) of the peeling direction of the protective sheet S1.

In such a manner, by peeling the protective sheet S1 from the corner portions C1 of the chips in the direction of the substantially diagonal line, the peeling resistance of the adhesive that occurs in the initial peeling period can be minimized. Therefore, it is possible to cleanly peel the protective sheet S1 preventing the adhesive of the protective sheet S1 from remaining on the chips C, and the causes of breakage and damage to the chips C, even when the chips C are ultra thin, can be effectively avoided.

The above is an example of a method for peeling the protective sheet S1 using the adhesive tape T of a specified length, to which the present invention is applied, but the present invention is not limited to this example. For example, the present invention can also be applied to a method for peeling the protective sheet S1 by attaching the adhesive tape by pressure to the entire length of the protective sheet S1 and peeling the adhesive tape. Also, in the embodiment, the peeling direction of the protective sheet S1 is determined by rotating the chips C using the chip retention rotating apparatus 22. However, it is also possible to place the chips C on an apparatus for peeling the protective sheet S1 to peel the protective sheet S1 from the corner portions C1 after determining the appropriate direction during the previous process.

As explained above, according to the present invention, because the protective sheet is peeled from the corner portions of the chips, the protective sheet can be cleanly peeled without leaving the adhesive on the chips, and breakage and damage can be prevented at the time of peeling even when the ultra thin chips to which the dicing before grinding method has been conducted are used.

What is claimed is:

1. A method for peeling a protective sheet that is attached to a circuit pattern surface after a dicing before grinding method is conducted on a semiconductor wafer on which the circuit pattern is formed and the semiconductor wafer is divided into chips, wherein the protective sheet is peeled from corner portions of the chips wherein the protective sheet is peeled in a substantially diagonal.

2. The method for peeling the protective sheet according to claim 1, wherein a thickness of the chips is 30 μm to 150 μm.

3. The method of claim 1, wherein a direction in which the protective sheet is peeled is maintained throughout the peeling process.

4. The method of claim 1, further comprising
    determining an orientation of said chips; and
    starting the peeling process from the corner portions of said chips based on the determined orientation.

5. The method of claim 4, further comprising repositioning said chips after said determining so that the peeling process can be properly started from the corner portions of said chips.

6. The method of claim 4, wherein, in said determining, a crystal orientation of said chips is determined.

7. The method of claim 1, further comprising
    attaching an end of an adhesive tape to the protective sheet; and
    pulling another end of the adhesive tape to peel the protective sheet off the chips.

8. A method of peeling a protective sheet off a circuit carrying surface of a semiconductor wafer after a dicing-before-grinding process has been conducted to divide the semiconductor wafer into individual chips, said method comprising:
    initial peeling of an edge portion of the protective sheet off the chips; and
    continued peeling of a remainder of the protective sheet off the chips;
    wherein
        each of said chips has a number of corners; and
        for each of said chips, the protective sheet is peeled off one of the corners before the other corners.

9. The method for peeling the protective sheet according to claim 8, wherein the protective sheet is peeled diagonally of said chips.

10. The method of claim 8, wherein a direction in which the protective sheet is peeled is maintained throughout the initial peeling and the continued peeling.

11. The method of claim 10, wherein said direction is not parallel with any side of any of said chips.

12. The method of claim 8, further comprising
    determining an orientation of said chips; and
    conducting said initial peeling based on the determined orientation.

13. The method of claim 12, further comprising repositioning said chips after said determining so that an adhesion area between the protective sheet and the chips in said edge portion of the protective sheet is minimized.

14. The method of claim 12, wherein, in said determining, a crystal orientation of said chips is determined.

15. The method of claim 8, further comprising
    attaching an end of an adhesive tape to the protective sheet before said initial peeling; and
    pulling another end of the adhesive tape to peel the protective sheet off the chips.

16. The method of claim 15, further comprising
    attaching said chips to a frame; and
    rotating said frame relative to said end of the adhesive tape before said end of said adhesive tape is attached to the edge portion of the protective sheet where an adhesion area between the protective sheet and the chips is minimized.

17. The method of claim 15, wherein said adhesive tape is attached to an entire length of said protective sheet.

18. A method for peeling a protective sheet that is attached to a circuit pattern surface after a dicing before grinding method is conducted on a semiconductor wafer on which the circuit pattern is formed and the semiconductor wafer is divided into chips, wherein a direction in which the protective sheet is peeled is not parallel with any side of any of said chips.

* * * * *